(12) United States Patent
Ho et al.

(10) Patent No.: US 8,987,752 B2
(45) Date of Patent: Mar. 24, 2015

(54) OPTOELECTRONIC DEVICE AND METHOD FOR MANUFACTURING THE SAME

(71) Applicant: Epistar Corporation, Hsinchu (TW)

(72) Inventors: Cheng Hsiang Ho, Hsinchu (TW); Biau-Dar Chen, Hsinchu (TW); Liang Sheng Chi, Hsinchu (TW); Chun Chang Chen, Hsinchu (TW); Pei Shan Fang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/896,570

(22) Filed: May 17, 2013

(65) Prior Publication Data

US 2013/0306993 A1    Nov. 21, 2013

(30) Foreign Application Priority Data

May 21, 2012   (TW) .............................. 101118101 A

(51) Int. Cl.

| H01L 27/15 | (2006.01) |
|---|---|
| H01L 29/26 | (2006.01) |
| H01L 31/12 | (2006.01) |
| H01L 33/00 | (2010.01) |
| H01L 33/26 | (2010.01) |
| B23K 26/00 | (2014.01) |
| H01L 33/20 | (2010.01) |

(52) U.S. Cl.
CPC ............ *H01L 33/26* (2013.01); *H01L 33/0095* (2013.01); *B23K 26/0039* (2013.01); *B23K 26/0057* (2013.01); *H01L 33/20* (2013.01); *B23K 2201/40* (2013.01)
USPC .......................................................... 257/79

(58) Field of Classification Search
USPC ............................. 257/40, 13, 79–103, 918, 257/E51.018–E51.022, E33.001–E33.077, 257/E33.054, E25.028, E25.032, E31.058, 257/E31.063, E31.115, E27.133–E27.139; 438/22–47, 69, 493, 503, 507, 956
See application file for complete search history.

(56) References Cited

U.S. PATENT DOCUMENTS

| 6,727,518 | B2* | 4/2004 | Uemura et al. | 257/79 |
|---|---|---|---|---|
| 8,012,784 | B2* | 9/2011 | Miki et al. | 438/46 |
| 8,120,042 | B2* | 2/2012 | Lee et al. | 257/79 |
| 2012/0261678 | A1* | 10/2012 | Hiraiwa et al. | 257/79 |
| 2013/0140592 | A1* | 6/2013 | Lee et al. | 257/98 |

\* cited by examiner

*Primary Examiner* — Dao H Nguyen
*Assistant Examiner* — Tram H Nguyen
(74) *Attorney, Agent, or Firm* — Ditthavong & Steiner, P.C.

(57) ABSTRACT

A method of fabricating an optoelectronic device, comprising: providing a substrate, wherein the substrate comprises a first major surface and a second major surface opposite to the first major surface; forming a light emitting stack on the second major surface of the substrate; forming a supporting layer covering the light emitting stack; forming a plurality of first modified regions in the substrate by employing a first energy into the substrate, wherein the supporting layer is formed before forming the plurality of first modified regions; forming an oxide layer on the first major surface of the substrate; and cleaving the substrate along the plurality of first modified regions.

20 Claims, 17 Drawing Sheets

OPTOELECTRONIC DEVICE AND METHOD FOR MANUFACTURING THE SAME

BACKGROUND

1. Technical Field

The present disclosure disclosed an optoelectronic device, which is especially related to a method of cleaving the optoelectronic device.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as an alternative light source for the illumination markets. The LED applies to various applications like the traffic signal, backlight module, street light, and medical instruments, and is gradually replacing the traditional lighting sources.

FIG. 1 illustrates the structure of a conventional light emitting device 100 which includes a transparent substrate 10, a semiconductor stack 12 formed above the transparent substrate 10, and an electrode 14 formed above the semiconductor stack 12, wherein the semiconductor stack 12 comprises, from the top, a first conductive-type semiconductor layer 120, an active layer 122, and a second conductive-type semiconductor layer 124.

In addition, the light emitting device 100 can be further connected to other components in order to form a light emitting apparatus. FIG. 2 illustrates a conventional light emitting apparatus including a sub-mount 20 carrying an electrical circuit 202, a solder 22 formed above the sub-mount 20; wherein the light emitting device 100 is bonded to the sub-mount 20 and is electrically connected with the electric circuit 202 on the sub-mount 20 by the solder 22, and an electrical connection structure 24 that electrically connects the electrode 14 of the light emitting device 100 to the electric circuit 202 on the sub-mount 20. The sub-mount 20 may be a lead frame or a large size mounting substrate in order to facilitate circuit design and enhance heat dissipation.

Nevertheless, because the surface of the transparent substrate 10 of the conventional light emitting device 100 as illustrated in FIG. 1 is substantially flat and the refractive index of the transparent substrate 10 is different from the refractive index of the external environment, the total internal reflection (TIR) occurs when a light A emitted from the active layer 122. Therefore the light extraction efficiency of the light emitting device 100 is reduced drastically.

SUMMARY OF THE DISCLOSURE

A method of fabricating an optoelectronic device, comprising: providing a substrate, wherein the substrate comprises a first major surface and a second major surface opposite to the first major surface; forming a light emitting stack on the second major surface of the substrate; forming a supporting layer covering the light emitting stack; forming a plurality of first modified regions in the substrate by employing a first energy into the substrate wherein the supporting layer is formed before forming the plurality of first modified regions; forming an oxide layer on the first major surface of the substrate; and cleaving the substrate along the plurality of the first modified regions.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1:
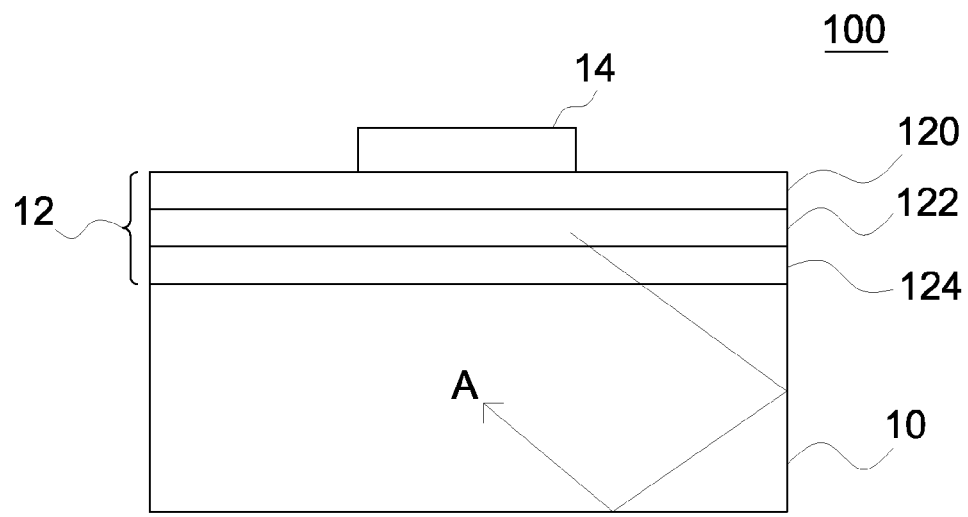
FIG. 1 illustrates the structure of a conventional light emitting device.

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations of FIG. 3A to FIG. 7.

Figure 3A:
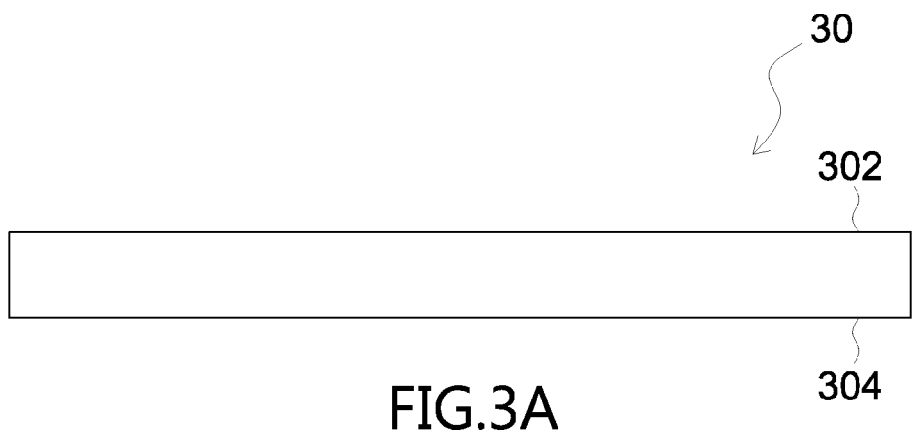
FIGS. 3A to 3I illustrate a process flow of a method of fabricating an optoelectronic device of a first embodiment of the present disclosure.
Figure 3B:
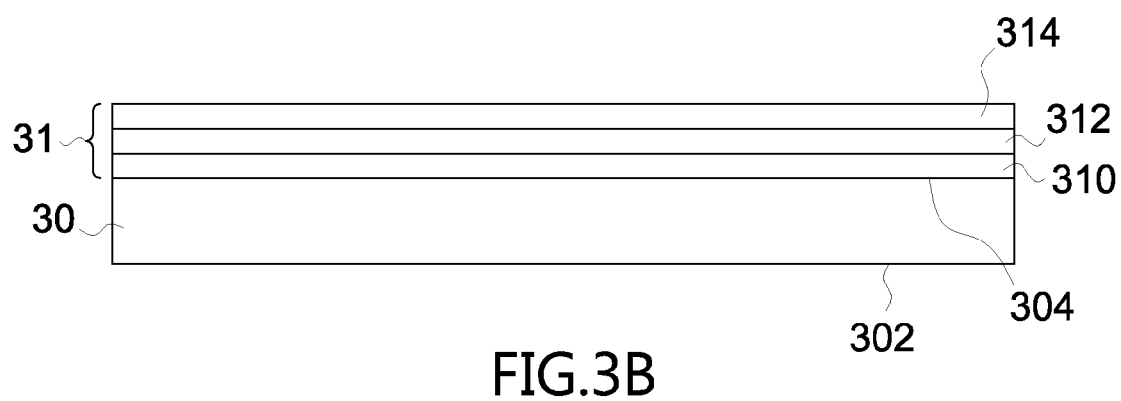

FIGS. 3A to 3I illustrate a process flow of the method of fabricating the optoelectronic device of a first embodiment of the present disclosure. FIG. 3A illustrates a substrate 30 including a first major surface 302 and a second major surface 304 wherein the first major surface 302 is opposite to the second major surface 304. FIG. 3B illustrates a plurality of a semiconductor epitaxial layers 31 formed on the second major surface 304 of the substrate 30, wherein the semiconductor epitaxial layers 31 includes a first conductive-type semiconductor layer 310, an active layer 312, and a second conductive-type semiconductor layer 314.

Figure 3C:
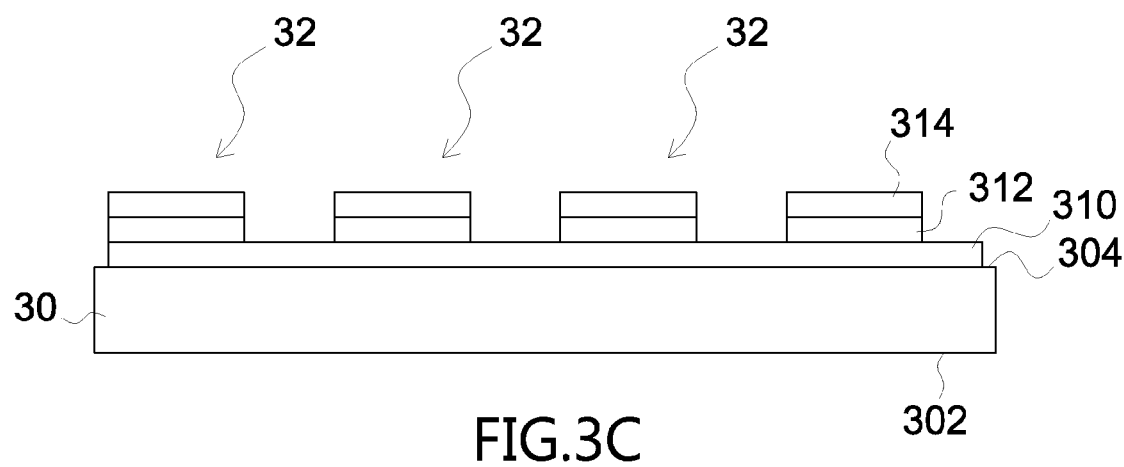

Following, FIG. 3C illustrates a further step by employing photolithography and etching process to etch the semiconductor epitaxial layer 31 in order to expose a portion of the first conductive-type semiconductor layer 310 and form a plurality of light emitting stacks 32 in mesa structure.

Figure 3D:
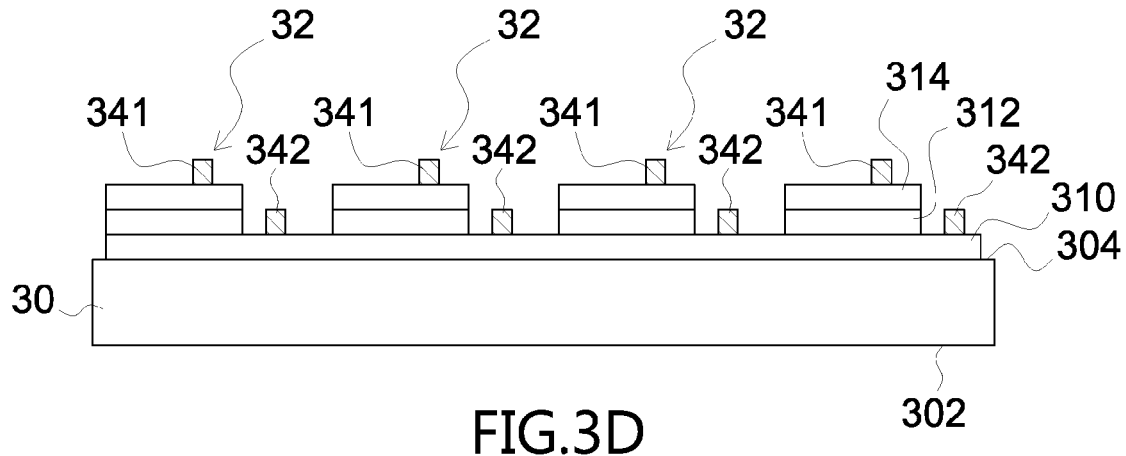

FIG. 3D illustrates a first electrode 342 is formed on the first conductive-type semiconductor layer 310 and a second electrode 341 is formed on the second conductive-type semiconductor layer 314. In one embodiment, the material of the first electrode 342 and the second electrode 341 can be made of metal material such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, Ge—Au—Ni, or the combination thereof.

Figure 3E:
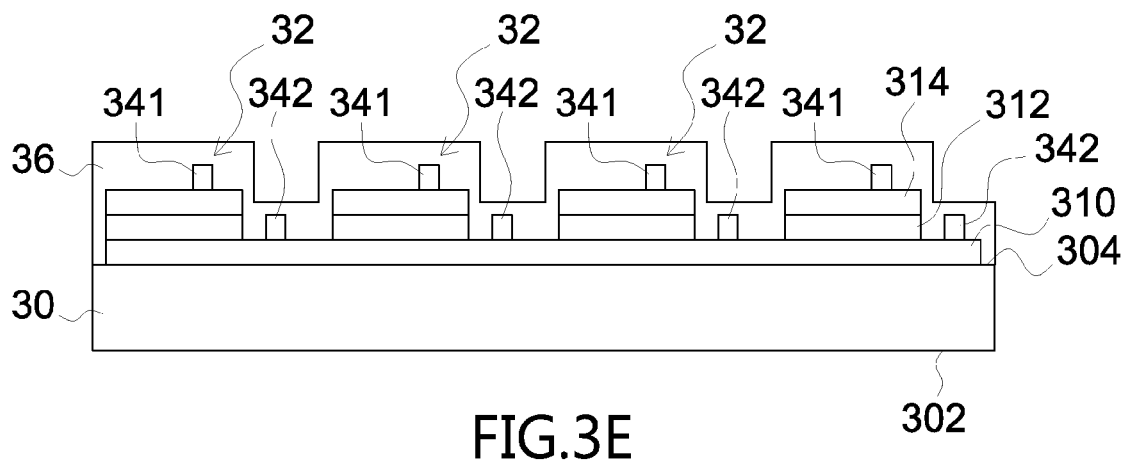

Following, FIG. 3E illustrates a supporting layer 36 formed on first electrode 342 and the second electrode 341. In one embodiment, the supporting layer 36 can also cover the light emitting stacks 32 and the substrate 30. The supporting layer 36 can prevent the light emitting stacks 32 from falling apart in the following process. The material of the supporting layer 36 can be polymer, oxide, or metal.

Figure 3F:
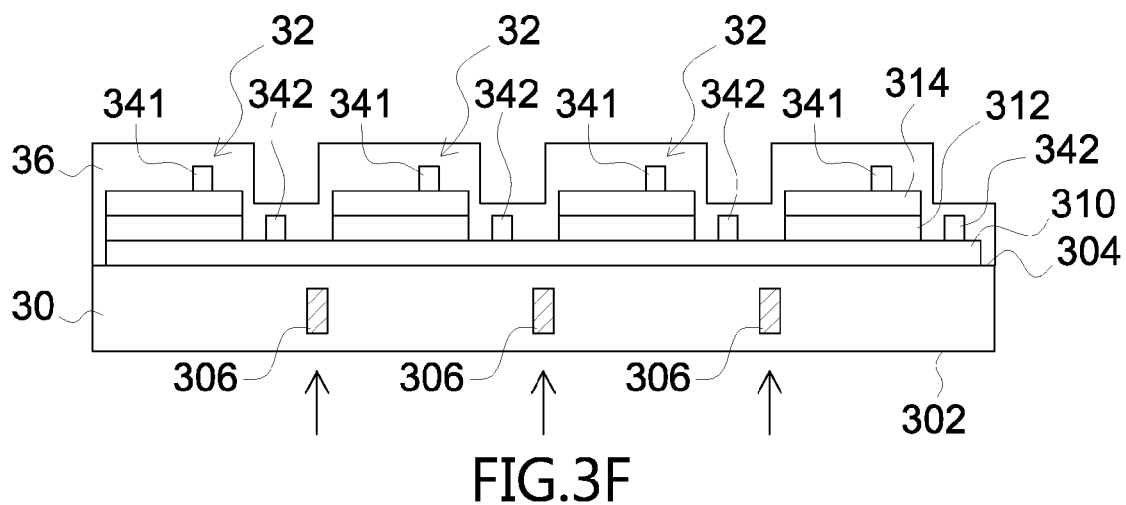
Figures 1, 3F:
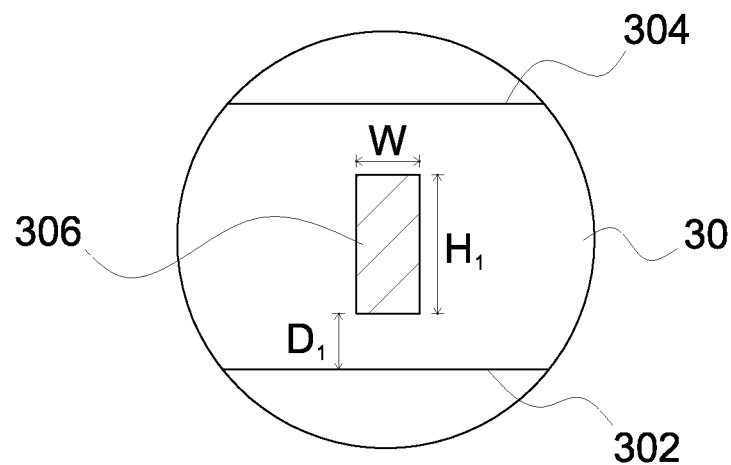
Figures 2, 3F:
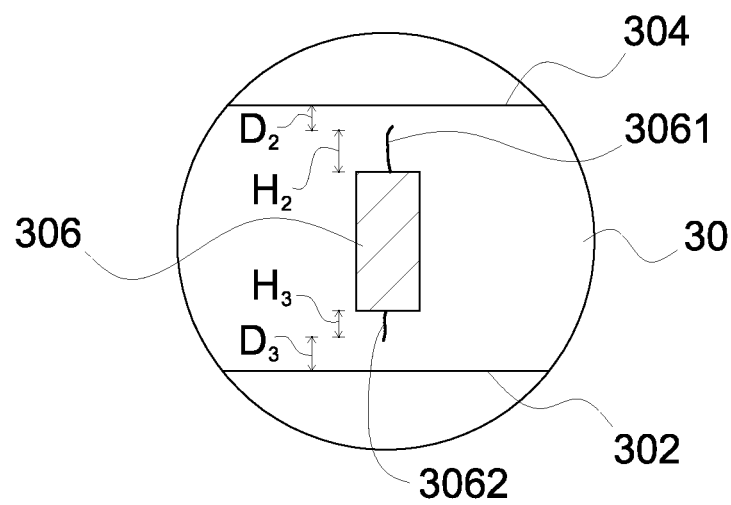

FIG. 3F illustrates a further step by employing a first laser with the energy of 0.05-0.1, 0.05-0.3, 0.05-0.5, 0.05-0.7, or 0.05-1 W; and the speed of 20-100, 20-300, 20-500, 20-700, or 20-1000 mm/sec; and the wavelength of 350-500, 350-800, 350-1200, 500-1000, 700-1200, or 350-1500 nm injecting from the first major surface 302 of the first substrate 30 into the substrate 30 and forming a plurality of the discontinuous first modified regions 306 in the substrate 30. In one embodiment, the laser can be an Infrared Laser, such as Nd—YAG laser, Nd—YVO$_4$ laser, Nd—YLF laser or titanium laser.

In one embodiment, the first modified region 306 can be a multiple photon absorption region, a crack region, a molten processed region or a refractive index change region.

As FIG. 3F-1 illustrates, the width W of the discontinuous first modified region 306 can be 1-5, 1-10, 1-15, or 1-20 μm; the height $H_1$ of the discontinuous first modified region 306 can be 1-10, 1-30, 1-50, 1-70, or 1-100 μm. In one embodiment, the distance $D_1$ of the first major surface 302 of the substrate 30 to the lower edge of the discontinuous first modified region 306 can be 1-50, 1-100, 1-150, or 1~200 μm.

Figure 2:
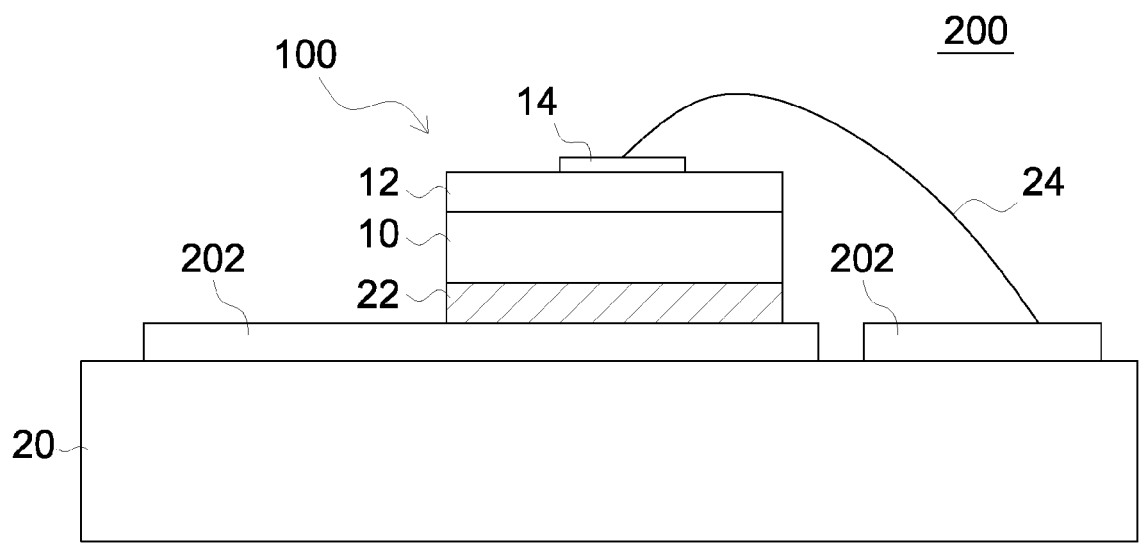
FIG. 2 illustrates the structure of a conventional light emitting apparatus.

In another embodiment, as FIG. 3F-2 illustrates, at least one first extension section 3061 is extended from the upper edge of the first modified region 306 and connected to the first modified region 306; and at least one second extension section 3062 is extended from the lower edge of the first modified region 306 and connected to the first modified region 306. The height $H_2$ of the first extension section 3061 can be 0.1-10, 0.1-50, 0.1-100, 0.1-150, or 0.1-200 μm. The distance $D_2$ of the top of the first extension section 3061 to the second major surface 304 of the substrate 30 can be 0-50, 0-100, 0-150, or 0~200 μm. The height $H_3$ of the second extension section 3062 can be 0.1-10, 0.1-50, 0.1-100, 0.1-150, or 0.1-200 μm. The distance $D_3$ of the bottom of the second extension section 3062 to the first major surface 302 of the substrate 30 can be 0-50, 0-100, 0-150, or 0~200 μm. In one embodiment, the height of the first extension section 3061 is larger than the height of the second extension section 3062.

Figures 3, 3F:
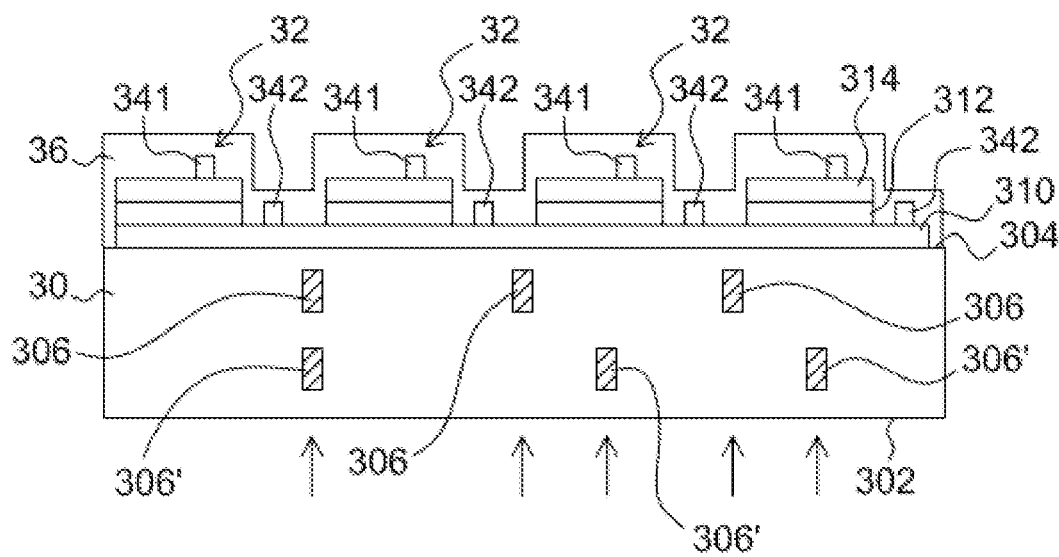

As FIG. 3F-3 illustrates, in another embodiment, employing a second laser with the energy of 0.05-0.1, 0.05-0.3, 0.05-0.5, 0.05-0.7, or 0.05-1 W; and the speed of 20-100, 20-300, 20-500, 20-700, or 20-1000 mm/sec; and the wavelength of 350-500, 350-800, 350-1200, 500-1000, 700-1200, or 350-1500 nm injecting from the first major surface 302 of the first substrate 30 into the substrate 30 and forming a plurality of the discontinuous second modified regions 306' in the substrate 30 wherein the first modified region 306 and the second modified region 306' in the direction of vertical to the first major surface 302 can be overlapped or not be overlapped. In one embodiment, the second laser can be an Infrared Laser, such as Nd—YAG laser, Nd—YVO$_4$ laser, Nd—YLF laser or titanium laser. In one embodiment, the first laser and the second laser can be the same.

In one embodiment, the second modified region 306' can be a multiple photon absorption region, a crack region, a molten processed region or a refractive index change region.

Figures 3, 3F, 4:
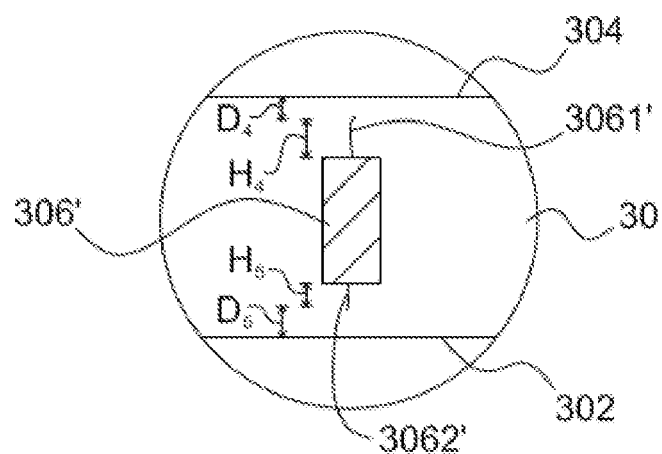

As FIG. 3F-4 shows, the same with the first modified region 306, at least one third extension section 3061' is extended from the upper edge of the second modified region 306' and connected to the second modified region 306'; and at least one fourth extension section 3062' is extended from the lower edge of the second modified region 306' and connected to the second modified region 306'. The height $H_4$ of the third extension section can be 0.1-10, 0.1-50, 0.1-100, 0.1-150, or 0.1-200 μm. The distance $D_4$ of the top of the third extension section to the second major surface 304 of the substrate 30 can be 0-50, 0-100, 0-150, or 0.about.200 μm. The height $H_5$ of the fourth extension section can be 0.1-10, 0.1-50, 0.1-100, 0.1-150, or 0.1-200 μm. The distance $D_5$ of the bottom of the fourth extension section to the first major surface 302 of the substrate 30 can be 0-50, 0-100, 0-150, or 0~200 μm. In one embodiment, the height $H_4$ of the third extension section is larger than the height $H_5$ of the fourth extension section.

Figures 1, 3G:
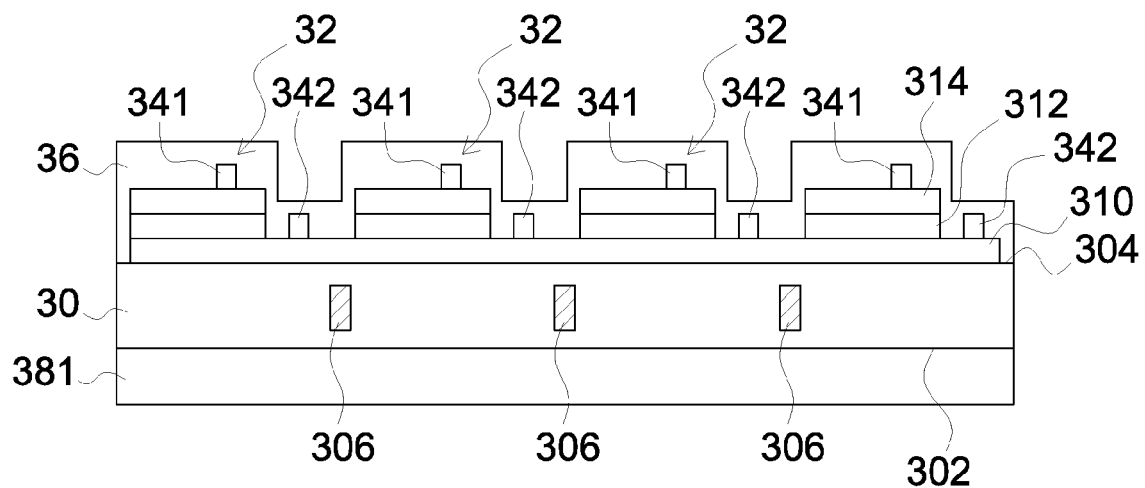
Figures 2, 3G:
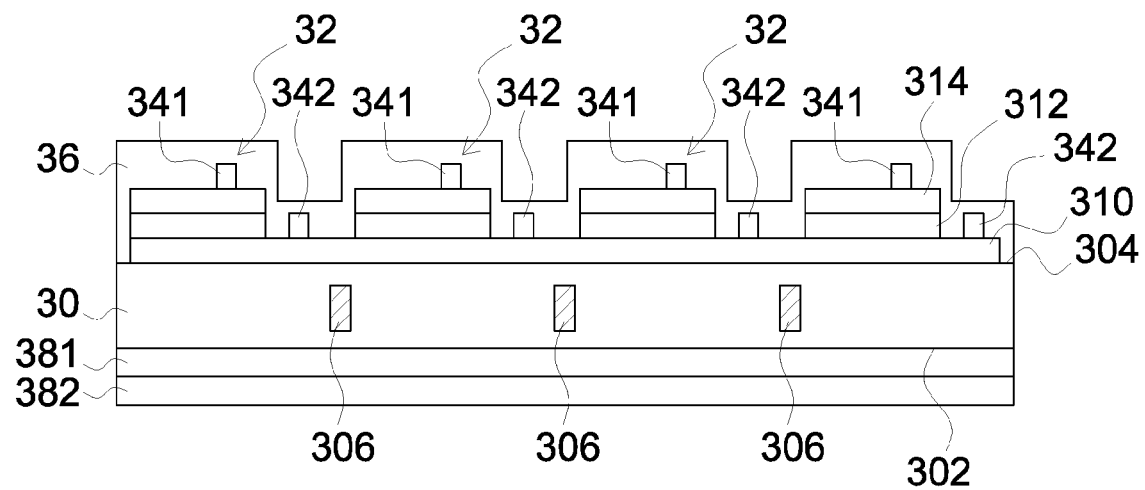

Following FIG. 3F, as FIG. 3G-1 illustrates, an oxide layer 381 is formed and substantially covering on the first major surface 302 of the substrate 30. In another embodiment, as illustrated in FIG. 3G-2, an oxide layer 381 and a metal reflective layer 382 can be formed on the first major surface 302 of the substrate 30. In one embodiment, the material of the oxide layer 381 can be $TiO_x$, $SiO_x$, ZnO, or $TaO_x$. The material of the metal reflective layer 382 can be Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, Ge—Au—Ni or the combination thereof.

Figure 3H:
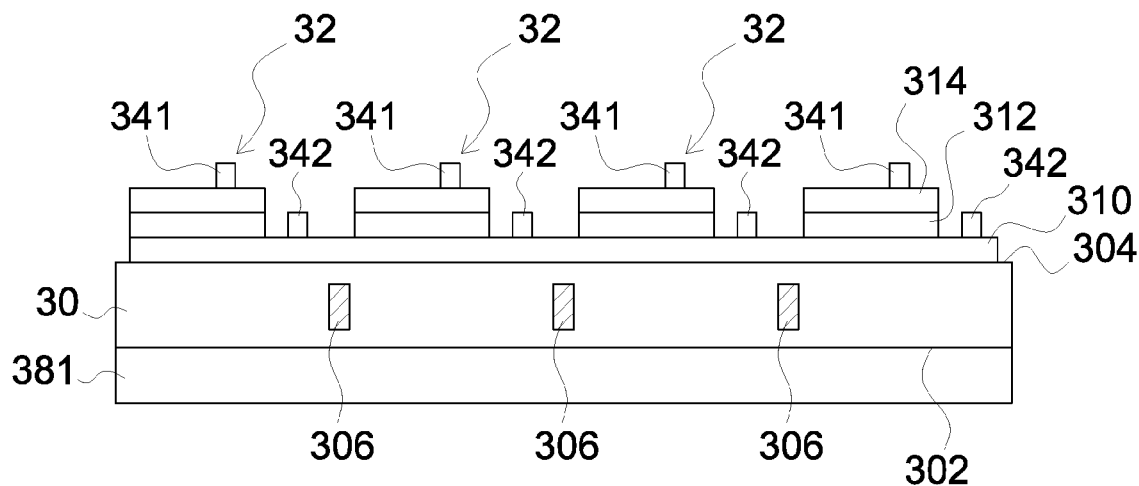
Figure 3I:
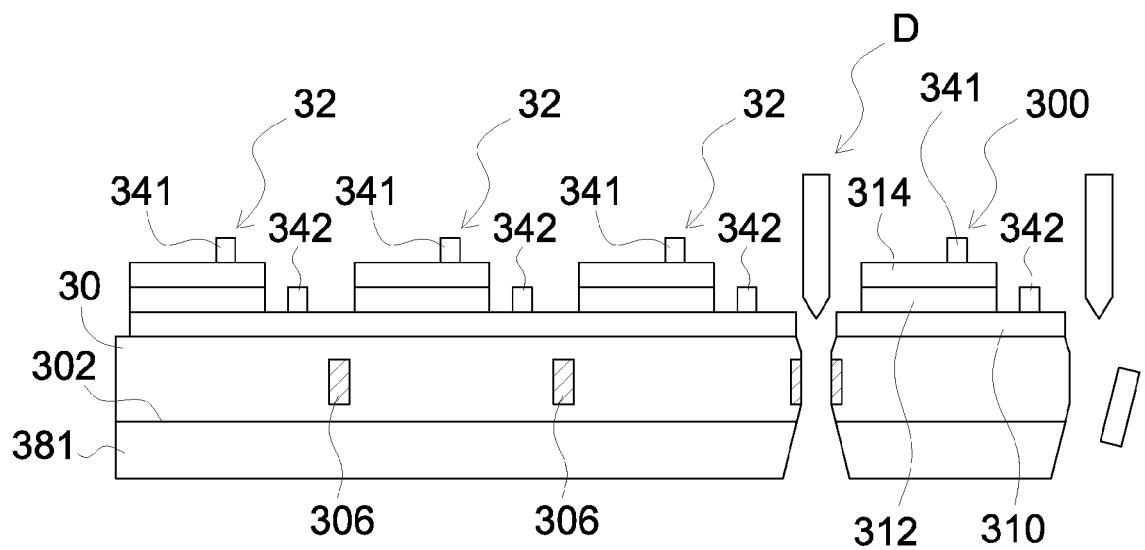

As FIG. 3H illustrates, the supporting layer 36 is removed. Following, as FIG. 3I illustrates, the substrate 30 is cleaved along the first modified region 306 to form a plurality of the optoelectronic devices 300. In one embodiment, the first major surface 302 of the substrate 30 of the optoelectronic device 300 is substantially covered by the oxide layer 381. In another embodiment, the 90% area of the first major surface 302 of the substrate 30 of the optoelectronic device 300 is covered by the oxide layer 381.

Figure 3J:
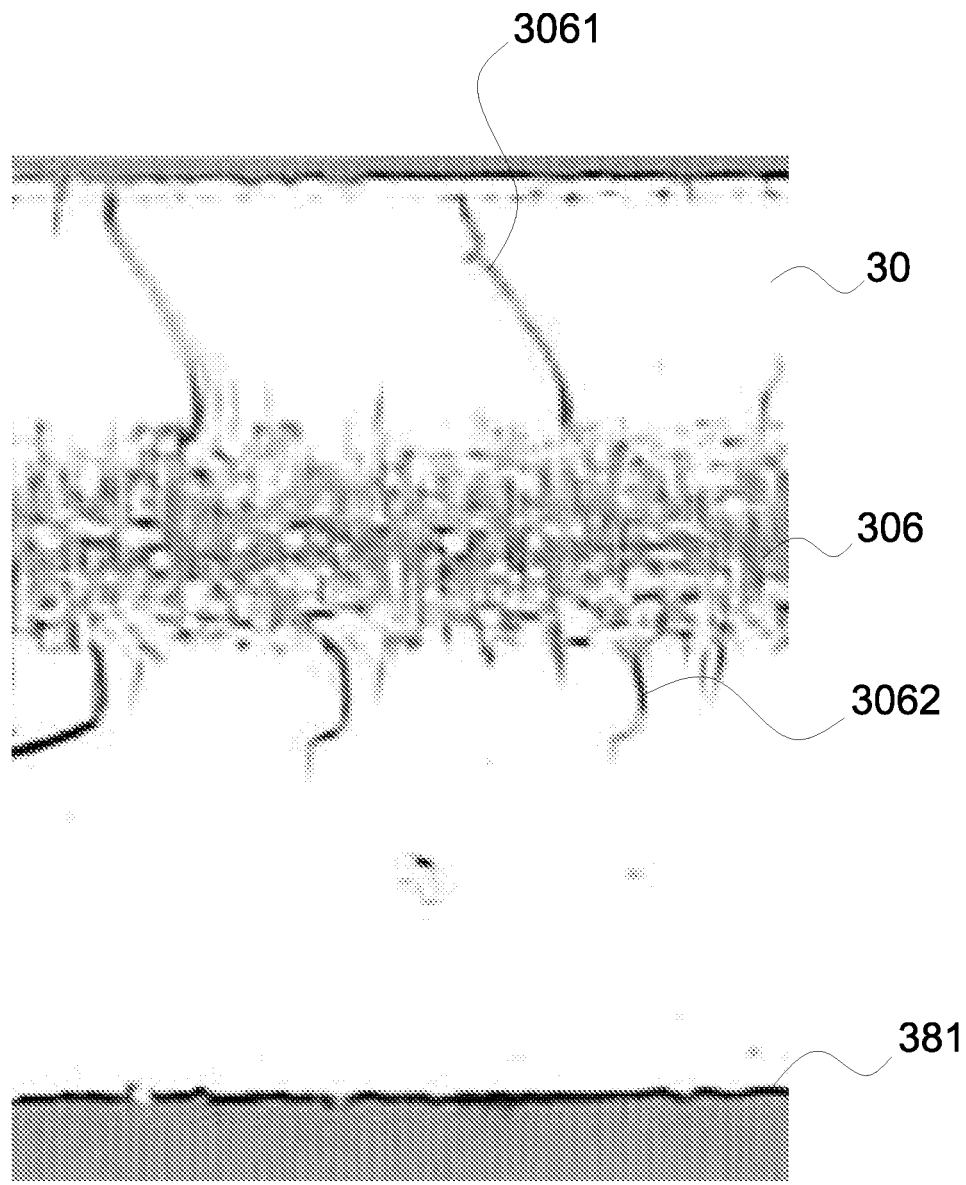
FIG. 3J illustrates a scanning electron microscopy (SEM) picture of the cross-sectional view of the cleaved substrate illustrated in FIG. 3I in the present disclosure.

FIG. 3J illustrates a scanning electron microscopy (SEM) picture of the cross-sectional view of the cleaved substrate 30 illustrated in FIG. 3I in the present disclosure including an oxide layer 381 formed on the first major surface 302 of the substrate 30 and the first modified region 306 formed inside the substrate 30. A first extension section 3061 is extended from the upper edge of the first modified region 306 and connected to the first modified region 306 and a second extension section 3062 is extended from the lower edge of the first modified region 306 and connected to the first modified region 306 and the height of the first extension section 3061 is larger than the height of the second extension section 3062.

Figure 4A:
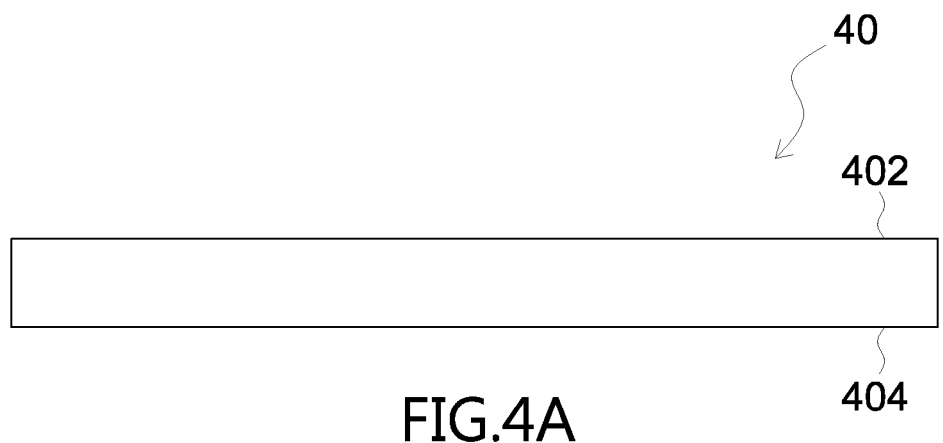
FIGS. 4A to 4H illustrate a process flow of another method of fabricating an optoelectronic device a second embodiment of the present disclosure.
Figure 4B:
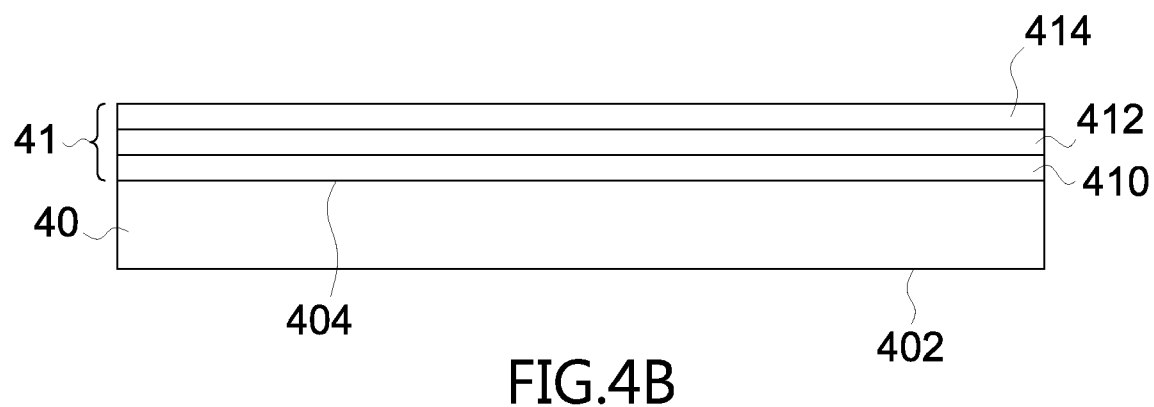

FIGS. 4A to 4H illustrate a process flow of the method of fabricating the optoelectronic device of a second embodiment of the present disclosure. FIG. 4A illustrates a substrate 40 including a first major surface 402 and a second major surface 404 wherein the first major surface 402 is opposite to the second major surface 404. FIG. 4B illustrates a plurality of semiconductor epitaxial layers 41 formed on the second major surface 404 of the substrate 40, wherein the semiconductor epitaxial layers 41 includes a first conductive-type semiconductor layer 410, an active layer 412, and a second conductive-type semiconductor layer 414.

Figure 4C:
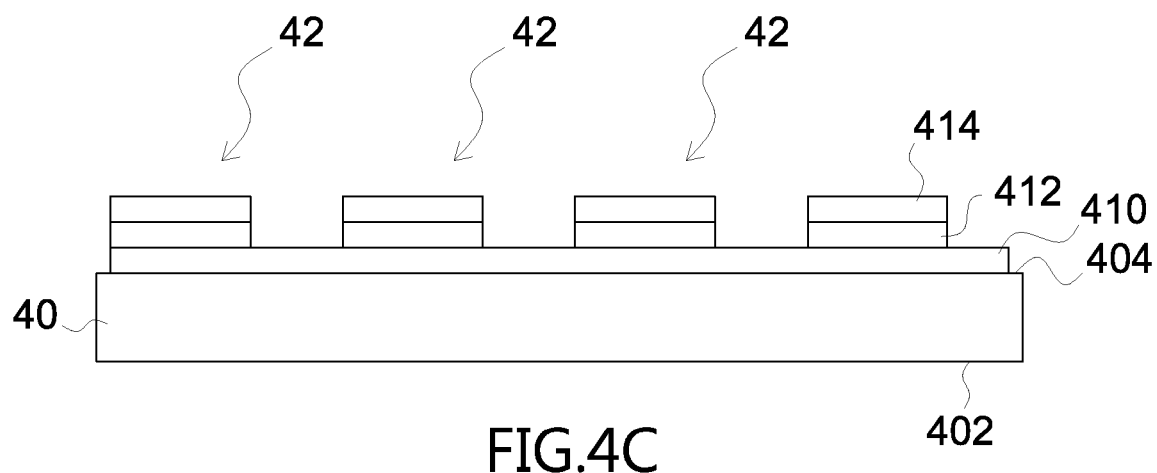

Following, FIG. 4C illustrates a further step by employing photolithography and etching process to etch the semiconductor epitaxial layers 41 in order to expose a portion of the first conductive-type semiconductor layer 410 and form a plurality of light emitting stacks 42 in mesa structure.

Figure 4D:
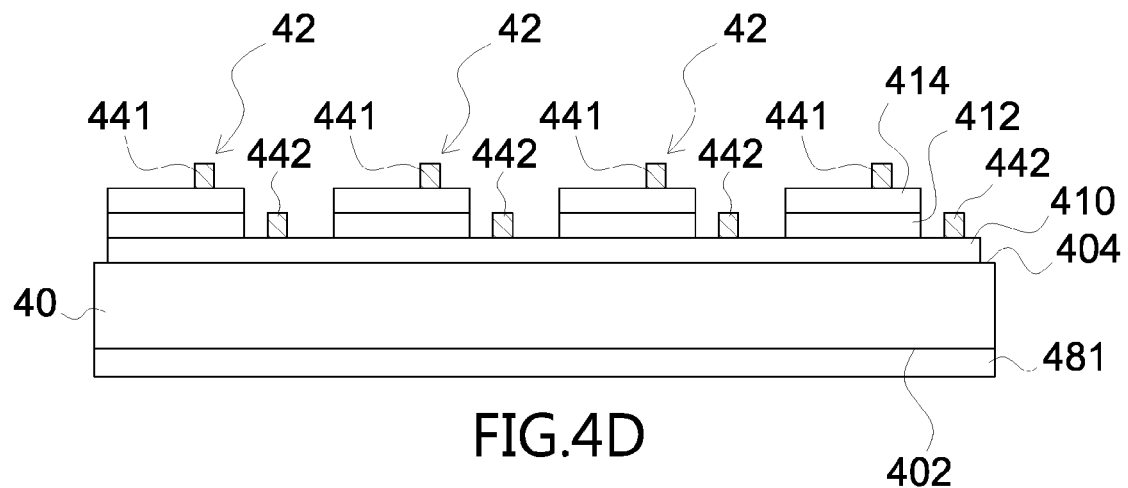

FIG. 4D illustrates a first electrode 442 formed on the first conductive-type semiconductor layer 410, a second electrode 441 formed on the second conductive-type semiconductor layer 414, and an oxide layer 481 formed on the first major surface 402 of the substrate 40. In one embodiment, the first major surface 402 of the substrate 40 is substantially covered by the oxide layer 481. In one embodiment, the material of the oxide layer 481 can be $TiO_x$, $SiO_x$, ZnO, or $TaO_x$.

In one embodiment, the material of the first electrode 442 and the second electrode 441 can be made of metal material such as Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, Ge—Au—Ni, or the combination thereof.

Figure 4E:
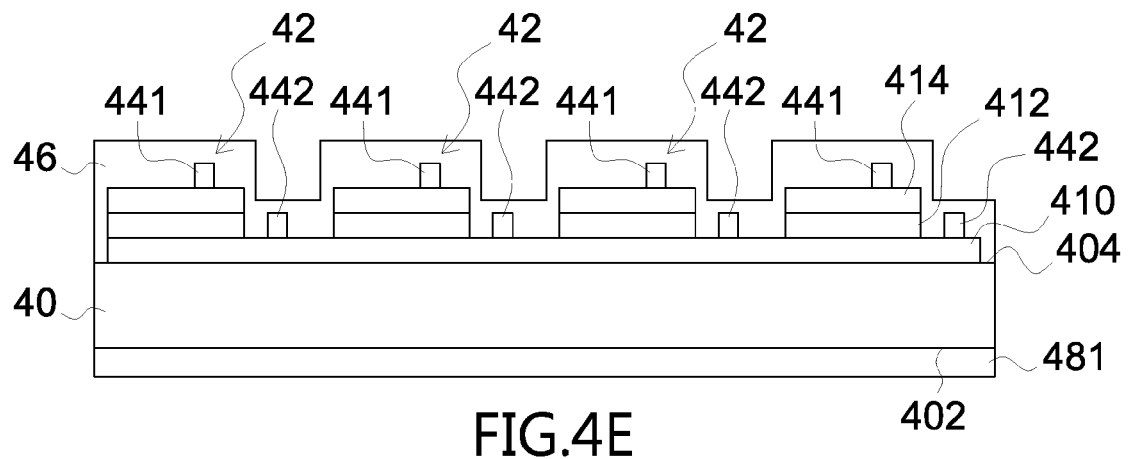

Following, FIG. 4E illustrates a supporting layer 46 formed on the light emitting stacks 42, the first electrode 442, and the second electrode 441. In another embodiment, the supporting layer 46 can also cover the light emitting stacks 42 and the substrate 40. The supporting layer 46 can prevent the light emitting stacks 42 from falling apart in the following process. The material of the supporting layer 46 can be polymer, oxide, or metal.

Figure 4F:
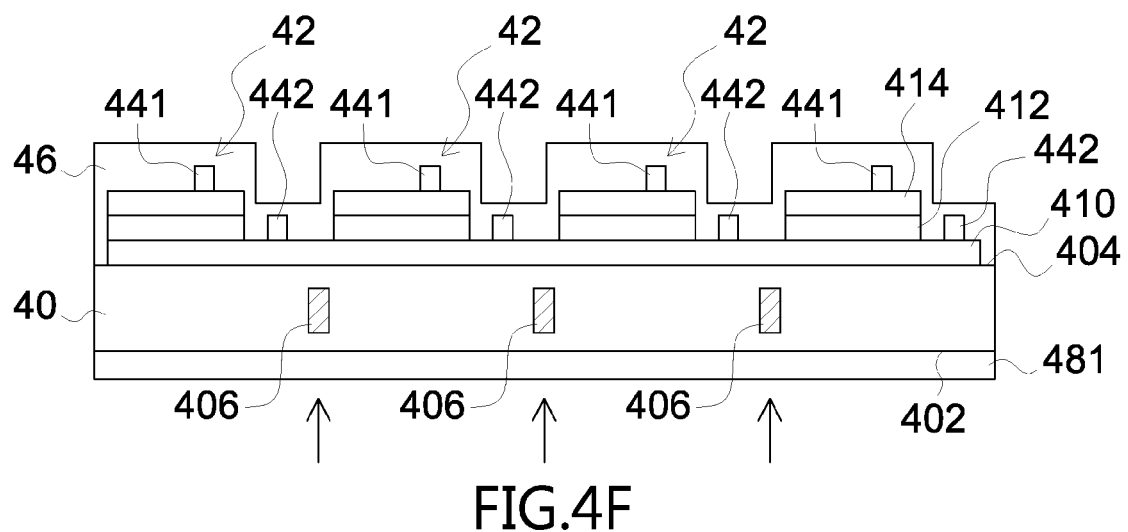
Figures 1, 4F:
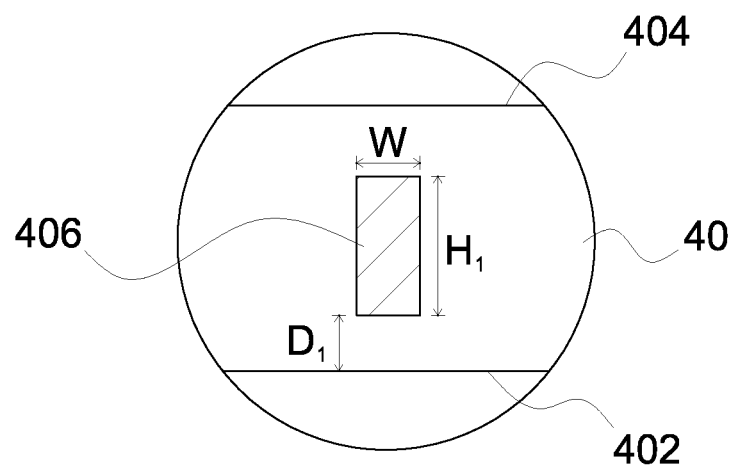
Figures 2, 4F:
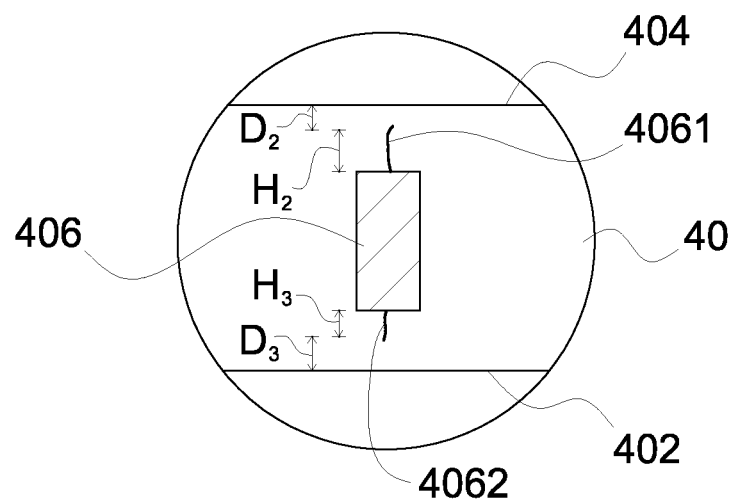
Figures 3, 4F:
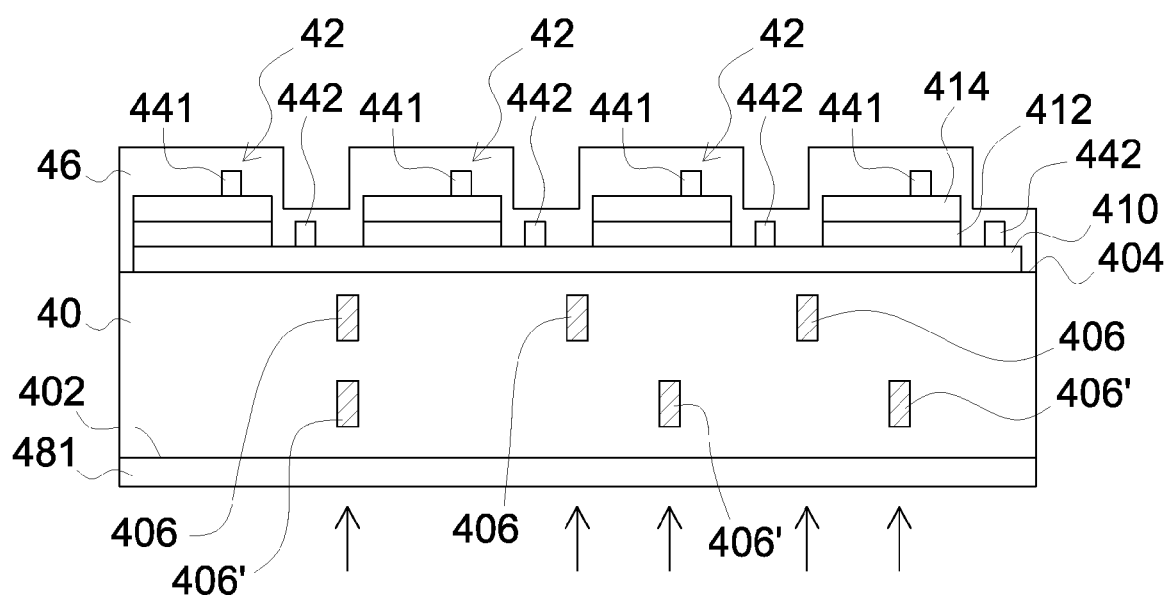

FIG. 4F illustrates a further step by employing a first laser with the energy of 0.05-0.1, 0.05-0.3, 0.05-0.5, 0.05-0.7, or 0.05-1 W; and the speed of 20-100, 20-300, 20-500, 20-700, or 20-1000 mm/sec; and the wavelength of 350-500, 350-800, 350-1200, 500-1000, 700-1200, or 350-1500 nm from the first major surface 402 of the first substrate 40 and through the oxide layer 481 and injecting into the substrate 40 and forming a plurality of discontinuous first modified regions 406 in the substrate 40. In one embodiment, the laser can be an Infrared Laser, such as Nd—YAG laser, Nd—$YVO_4$ laser, Nd—YLF laser, or titanium laser.

In one embodiment, the first modified region 406 can be a multiple photon absorption region, a crack region, a molten processed region or a refractive index change region.

As FIG. 4F-1 illustrates, the width W of the discontinuous first modified region 406 can be 1-5, 1-10, 1-15, or 1-20 μm; the height $H_1$ of the discontinuous first modified region 406 can be 1-10, 1-30, 1-50, 1-70, or 1-100 μm. In one embodiment, the distance $D_1$ of the first major surface 402 of the substrate 40 to the lower edge of the discontinuous first modified region 406 can be 1-50, 1-100, 1-150, or 1~200 μm.

In another embodiment, as FIG. 4F-2 illustrates, at least one first extension section 4061 is extended from the upper edge of the first modified region 406 and connected to the first modified region 406; and at least one second extension section 4062 is extended from the lower edge of the first modified region 406 and connected to the first modified region 406. The height $H_2$ of the first extension section 4061 can be 0.1-10, 0.1-50, 0.1-100, 0.1-150, or 0.1-200 μm. The distance $D_2$ of the top of the first extension section 4061 to the second major surface 404 of the substrate 40 can be 0-50, 0-100, 0-150, or 0~200 μm. The height $H_3$ of the second extension section 4062 can be 0.1-10, 0.1-50, 0.1-100, 0.1-150, or 0.1-200 μm. The distance $D_3$ of the bottom of the second extension section 4062 to the first major surface 402 of the substrate 40 can be 0-50, 0-100, 0-150, or 0~200 μm. In one embodiment, the height of the first extension section 4061 is larger than the height of the second extension section 4062.

As FIG. 4F-3 illustrates, in another embodiment, employing a second laser with the energy of 0.05-0.1, 0.05-0.3, 0.05-0.5, 0.05-0.7, or 0.05-1 W; and the speed of 20-100, 20-300, 20-500, 20-700, or 20-1000 mm/sec; and the wavelength of 350-500, 350-800, 350-1200, 500-1000, 700-1200, or 350-1500 nm from the first major surface 402 of the first substrate 40, through the oxide layer 481 and injecting into the substrate 40 and forming a plurality of the discontinuous second modified regions 406' in the substrate 40 wherein the first modified region 406 and the second modified region 406' can be overlapped or not be overlapped in the direction of vertical to the first major surface 402. In one embodiment, the second laser can be an Infrared Laser, such as Nd—YAG laser, Nd—$YVO_4$ laser, Nd—YLF laser, or titanium laser. In one embodiment, the first laser and the second laser can be the same.

In one embodiment, the second modified region 406' can be a multiple photon absorption region, a crack region, a molten processed region or a refractive index change region.

The same with the first modified region 406, at least one third extension section (not shown) is extended from the upper edge of the second modified region 406' and connected to the second modified region 406'; and at least one fourth extension section (not shown) is extended from the lower edge of the second modified region 406' and connected to the second modified region 406'. The height of the third extension section can be 0.1-10, 0.1-50, 0.1-100, 0.1-150, or 0.1-200 μm. The distance of the top of the third extension section to the second major surface 404 of the substrate 40 can be 0-50, 0-100, 0-150, or 0~200 μm. The height of the fourth extension section can be 0.1-10, 0.1-50, 0.1-100, 0.1-150, or 0.1-200 μm. The distance of the bottom of the fourth extension section to the first major surface 402 of the substrate 40 can be 0-50, 0-100, 0-150, or 0~200 μm. In one embodiment, the height of the third extension section is larger than the height of the fourth extension section.

Figure 4G:
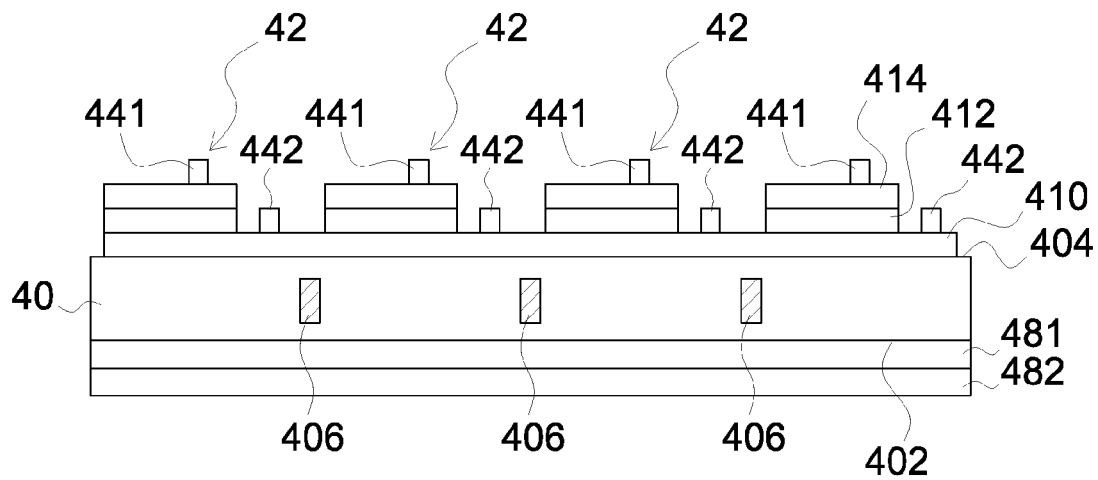

Following FIG. 4F, as FIG. 4G illustrates, metal reflective layer 482 can be formed on the oxide layer 481 and the supporting layer 46 is removed. In one embodiment, the material of the metal reflective layer 482 can be Cu, Al, In, Sn, Au, Pt, Zn, Ag, Ti, Ni, Pb, Pd, Ge, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, Au alloy, Ge—Au—Ni or the combination thereof.

Figure 4H:
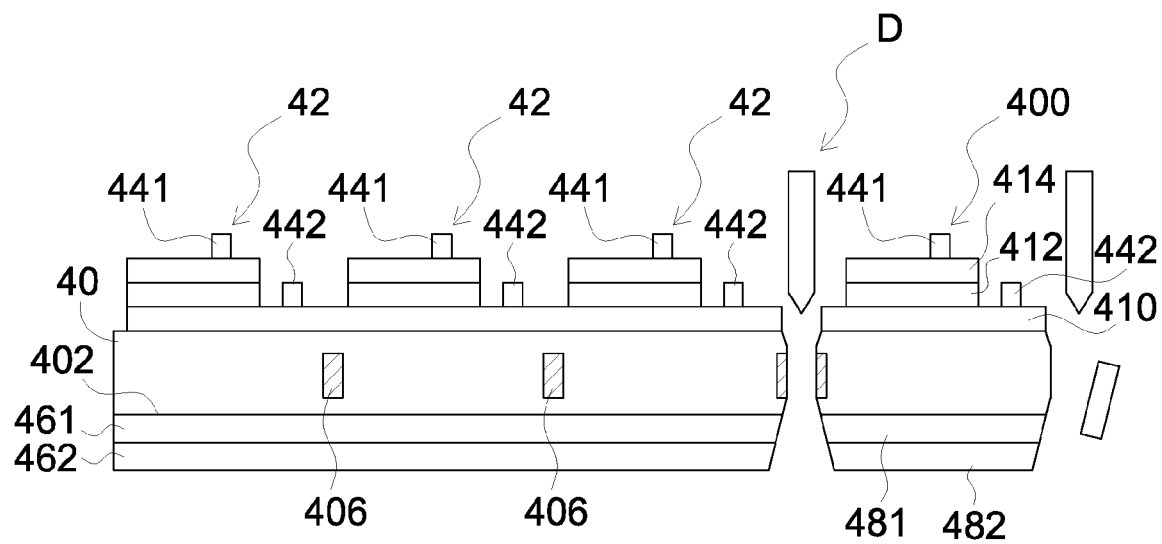

As FIG. 4H illustrates, the substrate 40 is cleaved along the first modified region 406 to form a plurality of the optoelectronic devices 400. In one embodiment, the first major surface 402 of the substrate 40 of the optoelectronic device 400 is substantially covered by the oxide layer 481 and the metal reflective layer 482. In another embodiment, the 90% area of the first major surface 402 of the substrate 40 of the optoelectronic device 400 is covered by the oxide layer 481 and the metal reflective layer 482.

Figure 5A:
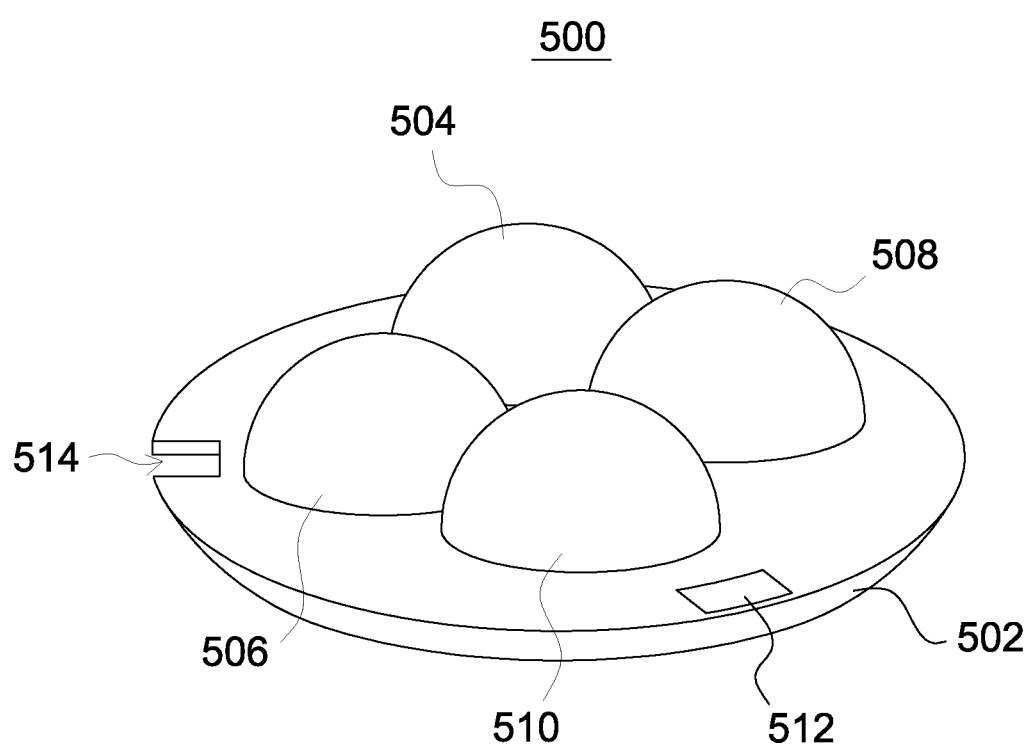
FIGS. 5A to 5C illustrates a LED module of an embodiment in the present disclosure.
Figure 5B:
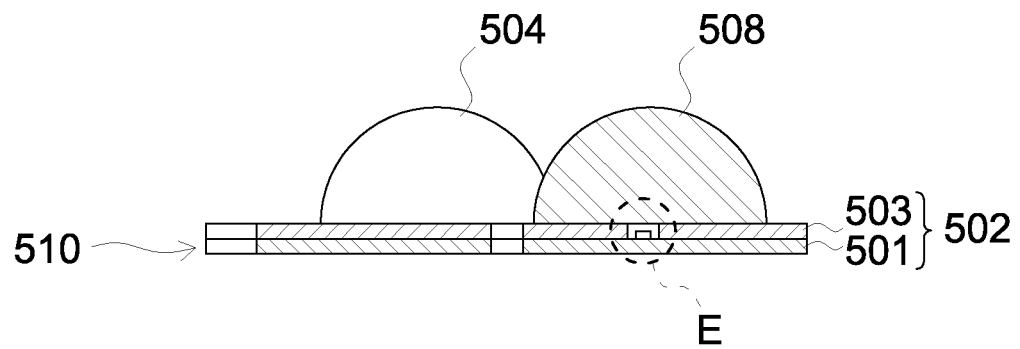
Figure 5C:
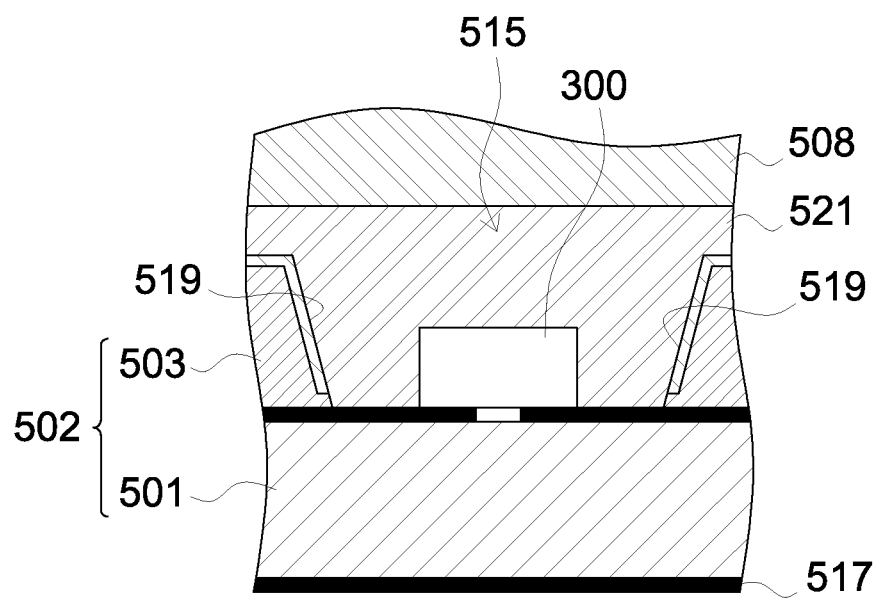

FIGS. 5A-5C illustrates an LED module of an application in the present disclosure. FIG. 5A is an external perspective view illustrating an optoelectronic device module 500 including a submount 502, an optoelectronic device (not illustrated) described above, a plurality of lens 504, 506, 508, 510, and two power supply terminals 512, 514. The optoelectronic device module 500 is attached to a lighting unit 600 (mentioned later).

FIG. 5B is a plan view illustrating the optoelectronic device module 500, and FIG. 5C is an enlarged view illustrating a portion E illustrated in FIG. 5B. As FIG. 5B illustrates, the submount 502 including an upper subunit 503 and a lower subunit 501, and at least one surface of the lower subunit 501 is contacted with the upper subunit 503. The lens 504, 508 are formed on the upper subunit 503. At least one through hole 515 is formed on the upper subunit 503 and at least one of the optoelectronic device 300 is formed inside the through hole 515 and contacted with the lower subunit 501. Besides, the optoelectronic device 300 is encapsulated by an encapsulating material 521 and a lens 508 is formed on the encapsulating material 521 wherein the material of the encapsulating material 521 may be a silicone resin, an epoxy resin or the like. In one embodiment, a reflecting layer 519 is formed on the sidewall of the through hole 515 to increase the light emitting efficiency. A metal layer 517 can be formed on the lower surface of the lower subunit 501 for improving heat dissipation.

Figure 6A:
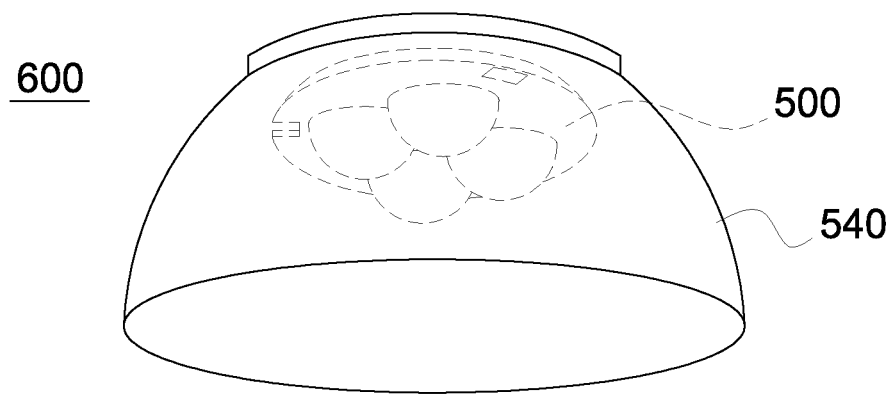
FIGS. 6A-6B illustrates a lighting apparatus of an embodiment in the present disclosure.
Figure 6B:
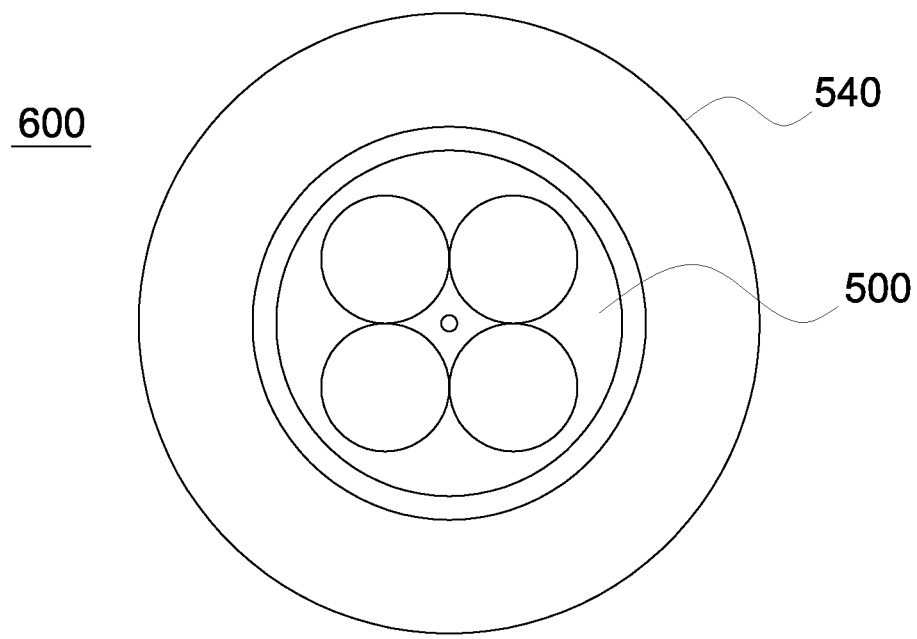

FIGS. 6A-6B illustrate a lighting apparatus of an embodiment in the present disclosure. The lighting apparatus 600 includes an optoelectronic device module 500, a case 540, a power supply circuit (not illustrated) to supply current to the optoelectronic device module 500, and a control unit (not illustrated) to control the power supply circuit. The lighting apparatus 600 can be an illumination device, such as street lamps, headlights or indoor illumination light source, and can be a traffic sign or a backlight module of the display panel.

Figure 7:
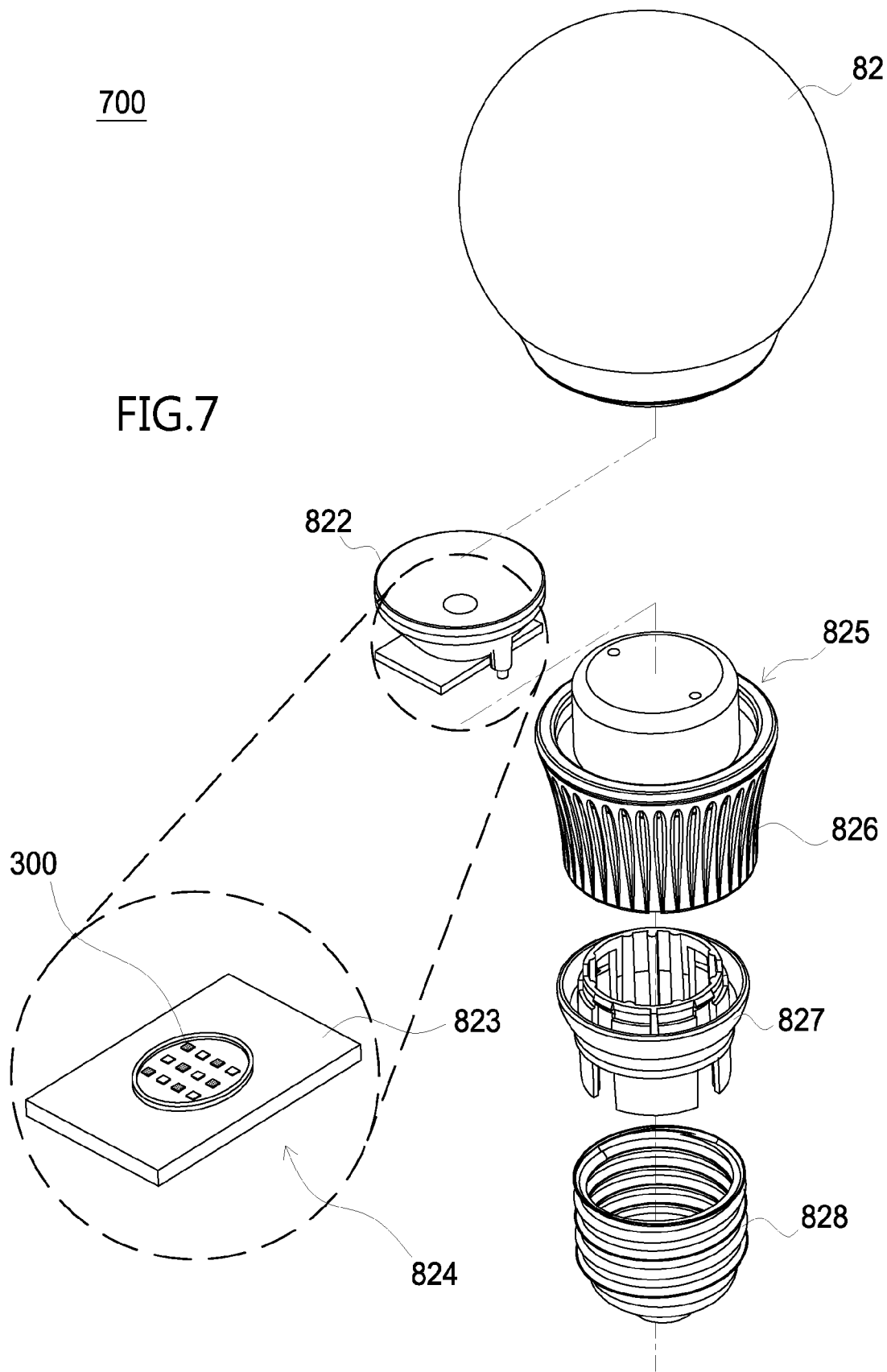
FIG. 7 is an explosive diagram of a bulb in accordance with an embodiment of the present application.

FIG. 7 illustrates an explosive diagram of a bulb in accordance with another application of the present application. The bulb 700 comprises a cover 821, a lens 822, a lighting module 824, a lamp holder 825, a heat sink 826, a connecting part 827, and an electrical connector 828. The lighting module 824 comprises a carrier 823 and a plurality of optoelectronic devices 300 of any one of the above mentioned embodiments on the carrier 823.

Specifically, the optoelectronic device comprises light-emitting diode (LED), photodiode, photo resister, laser diode, infrared emitter, organic light-emitting diode, and solar cell. The substrate 30, 40 can be a growing or carrying base. The material of the substrate 30, 40 comprises an electrically conductive substrate, electrically insulating substrate, transparent substrate, or opaque substrate. The material of the electrically conductive substrate can be metal such as Ge and GaAs, oxide such as $LiAlO_2$ and ZnO, nitrogen compound such as GaN and AlN, phosphide such as InP, silicon compound such as SiC, or Si. The material of the transparent substrate can be chosen from sapphire ($Al_2O_3$), $LiAlO_2$, ZnO, GaN, AlN, glass, diamond, CVD diamond, diamond-like carbon (DLC), spinel ($MgAl_2O_3$), $SiO_x$, or $LiGaO_2$.

The first conductive-type semiconductor layer 310, 410 and the second conductive-type semiconductor layer 314, 414 are different in electricity, polarity or dopant, or are different semiconductor materials used for providing electrons and holes, wherein the semiconductor material can be single semiconductor material layer or multiple semiconductor material layers. The polarity can be chosen from any two of p-type, n-type and i-type. The active layer 312, 412 is disposed between the first conductive-type semiconductor layer 310, 410 and the second conductive-type semiconductor layer 314, 414 respectively where the electrical energy and the light energy can be converted or stimulated converted. The devices which can convert or stimulated convert the electrical energy into the light energy are like light-emitting diode, liquid crystal display, and organic light-emitting diode. The devices which can convert or stimulated convert the light energy into the electrical energy are like solar cell and light emitting diode. The material of the first conductive-type semiconductor layer 310, 410, the active layer 312, 412, and the second conductive-type semiconductor layer 314, 414 comprises one element selected from the group consisting of Ga, Al, In, As, P, N, Si, and the combination thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof. The structure of the active layer (not illustrated) can be single heterostructure (SH), double heterostructure (DH), double-side double heterostructure (DDH) or multi-quantum well (MQW), wherein the wavelength of the light emitted from the active layer (not illustrated) can be changed by adjusting the number of the pairs of MQW.

In one embodiment of the application, a buffer layer (not illustrated) can be selectively disposed between the first conductive-type semiconductor layer 310, 410 and the substrate 30, 40. The buffer layer is between the two material systems to transit the material system of the substrate 30, 40 to the material system of the first conductive-type semiconductor layer 310, 410. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

A contacting layer (not illustrated) can be selectively formed on the second conductive-type semiconductor layer 314, 414. The contacting layer is disposed on the side of the second conductive-type semiconductor layer 314, 414 away from the active layer 312, 412. Specifically, the contacting layer can be optical layer, electrical layer, or the combination thereof. The optical layer can change the radiation or the light from or entering the active layer 312, 412, wherein what the optical layer can change is not limited to the frequency, the wavelength, the intensity, the flux, the efficiency, the color temperature, rendering index, light field, or angle of view. The electrical layer can change the value, density, distribution of voltage, resistor, current and capacitance of any two relative sides of the contacting layer. The material of the contacting layer comprises oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be selected from InTiO, CdSnO, SbSnO, InZnO, ZnAlO or ZnSnO. If the material of the contacting layer is transparent metal, the thickness of the contacting layer is in a range of 0.005 μm~0.6 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method of fabricating an optoelectronic device, comprising:
   providing a substrate, wherein the substrate comprises a first major surface and a second major surface opposite to the first major surface;
   forming a light emitting stack on the second major surface of the substrate;
   forming a supporting layer covering the light emitting stack;
   forming a plurality of first modified regions in the substrate by employing a first energy into the substrate, wherein the supporting layer is formed before forming the plurality of first modified regions;
   forming an oxide layer on the first major surface of the substrate; and
   cleaving the substrate along the plurality of first modified regions.

2. The method of fabricating the optoelectronic device of claim 1, wherein
   the first energy is from a laser and the wavelength of the laser is 350-1500 nm, and/or
   the first energy of the laser is 0.05-1 W, and/or the speed of the laser is 20-1000 mm/sec.

3. The method of fabricating the optoelectronic device of claim 1, further comprising a step to remove the supporting layer.

4. The method of fabricating the optoelectronic device of claim 1, wherein the light emitting stack layer comprises a first conductive-type semiconductor layer formed on the second major surface of the substrate, an active layer formed on the first conductive-type semiconductor layer, and a second conductive-type semiconductor layer formed on the active layer.

5. The method of fabricating the optoelectronic device of claim 1, wherein the material of the light emitting stack layer comprises one element selected from the group consisting of Al, Ga, In, As, P, and N.

6. The method of fabricating the optoelectronic device of claim 1, further comprising a first extension section extended from an upper edge of the first modified region and formed between the first modified region and the second major surface of the substrate.

7. The method of fabricating the optoelectronic device of claim 5, further comprising a second extension section extended from the lower edge of the first modified region and formed between the first modified region and the first major surface of the substrate, and/or wherein a height of the first extension section is larger than a height of the second extension section.

8. The method of fabricating the optoelectronic device of claim 1, further comprising forming a plurality of second modified regions in the substrate by employing a second energy into the substrate wherein the first modified region and the second modified region are overlapped or not be overlapped in the direction of vertical to the first major surface of the substrate.

9. The method of fabricating the optoelectronic device of claim 8, wherein the first energy and the second energy are provided by the same source.

10. An optoelectronic device, comprising:
    a substrate comprising a first major surface and a second major surface opposite to the first major surface;
    a light emitting stack formed on the second major surface of the substrate;
    an oxide layer formed on the first major surface of the substrate and the oxide layer substantially covering the first major surface of the substrate; and
    a plurality of first modified regions formed in the substrate, wherein one of the plurality of first modified regions has a first extension section extended from an upper edge of the first modified regions and formed between the first modified region and the second major surface of the substrate and a width of the first extension section is smaller than a width of the first modified region.

11. The optoelectronic device of claim 10, wherein the plurality of first modified regions is discontinuous.

12. The optoelectronic device of claim 10, wherein the material of the light emitting stack comprises one element selected from the group consisting of Al, Ga, In, As, P, and N.

13. The optoelectronic device of claim 10, wherein the light emitting stack comprises a first conductive-type semiconductor layer formed on the second major surface of the substrate, an active layer formed on the first conductive-type semiconductor layer and a second conductive-type semiconductor layer formed on the active layer.

14. The optoelectronic device of claim 10, further comprising a metal layer formed on the oxide layer.

15. The optoelectronic device of claim 10, wherein the width of the first modified region is 0.1-20 μm, a height of the first modified region is 1-100 μm, and/or a distance of the first major surface of the substrate to the lower edge of the first modified region is 1~200 μm.

16. The optoelectronic device of claim 10, further comprising a second extension section extended from the lower edge of the first modified region and formed between the first modified region and the first major surface of the substrate, and/or wherein a height of the first extension section is larger than a height of the second extension section.

17. The optoelectronic device of claim 10, further comprising a plurality of second modified regions formed in the substrate wherein the first modified region and the second modified region are overlapped or not overlapped in the direction of vertical to the first major surface of the substrate.

18. The optoelectronic device of claim 17, further comprising a third extension section extended from an upper edge of the second modified region and connected to the second modified region.

19. The optoelectronic device of claim 18, further comprising a fourth extension section extended from the lower edge of the second modified region and connected to the second modified region, and/or wherein a height of the first extension section is larger than a height of the second extension section.

20. The method of fabricating the optoelectronic device of claim 6, wherein a width of the first extension section is smaller than a width of the first modified region.

* * * * *